United States Patent
Chen

(10) Patent No.: US 9,530,590 B2
(45) Date of Patent: *Dec. 27, 2016

(54) LUMINOUS KEYBOARD

(71) Applicant: Primax Electronics Ltd., Neihu, Taipei (TW)

(72) Inventor: Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 204 days.

This patent is subject to a terminal disclaimer.

(21) Appl. No.: 13/801,318

(22) Filed: Mar. 13, 2013

(65) Prior Publication Data

US 2014/0138229 A1 May 22, 2014

(30) Foreign Application Priority Data

Nov. 21, 2012 (TW) .............................. 101143410 A

(51) Int. Cl.
*H01H 13/83* (2006.01)
*H03K 17/98* (2006.01)
*H01H 3/12* (2006.01)

(52) U.S. Cl.
CPC .............. *H01H 13/83* (2013.01); *H03K 17/98* (2013.01); *H01H 3/125* (2013.01); *H01H 2219/058* (2013.01); *H01H 2219/062* (2013.01); *H01H 2219/066* (2013.01); *H01H 2239/006* (2013.01); *H03K 2217/9655* (2013.01)

(58) Field of Classification Search
CPC . H01H 3/125; H01H 13/023; H01H 2219/014

USPC ................................................... 200/5 A, 310
See application file for complete search history.

(56) References Cited

U.S. PATENT DOCUMENTS

| | | | |
|---|---|---|---|
| 5,950,810 A * | 9/1999 | Pan et al. ........................ | 200/344 |
| 6,860,612 B2 * | 3/2005 | Chiang et al. .................. | 362/29 |
| 9,086,733 B2 * | 7/2015 | Pance .................... | G06F 3/0202 |
| 2002/0144884 A1 | 10/2002 | Kurihara ................ | H01H 13/70 200/263 |
| 2009/0014305 A1* | 1/2009 | Aihara et al. .................. | 200/512 |
| 2010/0084253 A1* | 4/2010 | Bollmann et al. ............ | 200/5 R |
| 2010/0288615 A1* | 11/2010 | MaFune ................. | H01H 13/83 200/5 A |
| 2011/0147182 A1* | 6/2011 | Chen ............................ | 200/314 |
| 2012/0032820 A1* | 2/2012 | Lin ................................ | 341/22 |
| 2012/0037482 A1* | 2/2012 | Dai .............................. | 200/341 |
| 2014/0034472 A1* | 2/2014 | Krumpelman et al. ....... | 200/5 A |

(Continued)

*Primary Examiner* — Renee S Luebke
*Assistant Examiner* — Ahmed Saeed
(74) *Attorney, Agent, or Firm* — Kirton McConkie; Evan R. Witt

(57) ABSTRACT

A luminous keyboard includes plural bottom-emitting type illumination elements, a sensing module, plural keys, and a light-transmissible supporting plate. As a key is moved toward the sensing module, the sensing module generates a corresponding non-contact key signal. Each bottom-emitting type illumination element is aligned with the corresponding key, and disposed under the corresponding key. The light-transmissible supporting plate is arranged between the plural bottom-emitting type illumination elements and the plural keys. After the light beam provided by each bottom-emitting type illumination element is transmitted through the light-transmissible supporting plate, the light beam is projected to the corresponding key.

23 Claims, 15 Drawing Sheets

(56) References Cited

U.S. PATENT DOCUMENTS

2014/0138228 A1* 5/2014 Chen .......................... 200/5 A

* cited by examiner

LUMINOUS KEYBOARD

FIELD OF THE INVENTION

The present invention relates to a luminous keyboard, and more particularly to a luminous keyboard with an illuminating function.

BACKGROUND OF THE INVENTION

Recently, with increasing development of information industries, portable information devices such as notebook computers, mobile phones or personal digital assistants are widely used in many instances. In a case that a portable information device is used in a dim environment, the numbers and the characters marked on the keys of the keyboard of the portable information device are not clearly visible. In other words, the dim environment becomes hindrance from operating the keyboard. In addition, if the numbers and the characters marked on the keys of the keyboard are reluctantly viewed in the dim environment, the user is readily suffered from vision impairment. For solving these drawbacks, a luminous keyboard has been disclosed. The luminous keyboard can be used in the dim environment in order to enhance the applications thereof. Moreover, by changing the layout of the luminous regions of the luminous keyboard, the information device having the luminous keyboard is more aesthetically-pleasing and thus the competiveness thereof is enhanced.

FIG. 1 is a schematic cross-sectional view illustrating a conventional luminous keyboard. As shown in FIG. 1, the luminous keyboard 1 comprises a reflector 11, a light guide plate 12, a supporting plate 13, a membrane wiring board 14, plural keys 15, and plural lateral-emitting type illumination elements 16. The membrane wiring board 14 comprises a lower wiring plate 141, an upper wiring plate 142, and an intermediate plate 143. The intermediate plate 143 is arranged between the lower wiring plate 141 and the upper wiring plate 142. The lower wiring plate 141, the intermediate plate 143 and the upper wiring plate 142 are all made of transparent light-guiding material. The transparent light-guiding material includes for example polycarbonate (PC) or polyethylene terephthalate (PET).

Please refer to FIG. 2, which is a schematic exploded view illustrating a membrane wiring board of the conventional luminous keyboard of FIG. 1. The lower wiring plate 141 comprises a first circuit pattern 1411. The first circuit pattern 1411 comprises plural silver paste conductive element lines 14111 and plural lower contacts 14112. The upper wiring plate 142 comprises a second circuit pattern 1421. The second circuit pattern 1421 comprises plural silver paste conductive element lines 14211 and plural upper contacts 14212. The intermediate plate 143 comprises plural perforations 1431 corresponding to the plural lower contacts 14112 and the plural upper contacts 14212, respectively. Each of the upper contacts 14212 and the corresponding lower contacts 14112 are collectively defined as a membrane switch 144.

The supporting plate 13 is disposed under the membrane wiring board 14. In addition, the supporting plate 13 comprises plural openings 131, a first fixing structure 132, and a second fixing structure 133. Each of the keys 15 comprises a keycap 151, an elastic element 152, and a scissors-type connecting element 153. The keycap 151 comprises a first keycap connecting structure 1511 and a second keycap connecting structure 1512. The scissors-type connecting element 153 comprises a first frame 1531 and a second frame 1532. In addition, the elastic element 152 is arranged between the keycap 151 and the membrane wiring board 14.

The membrane wiring board 14 further comprises apertures 145 and 146 (see FIG. 1). The first fixing structure 132 and the second fixing structure 133 are penetrated through the apertures 145 and 146, respectively. A first end 15311 of the first frame 1531 is connected to the second fixing structure 133, and a second end 15312 of the first frame 1531 is connected to the first keycap connecting structure 1511. In addition, a first end 15321 of the second frame 1532 is connected to the first fixing structure 132, and a second end 15322 of the second frame 1532 is connected to the second keycap connecting structure 1512.

As any key 15 is depressed and moved downwardly relative to the supporting plate 13, the first frame 1531 and the second frame 1532 of the scissors-type connecting element 153 are switched from an open-scissors state to a folded state. Moreover, as the keycap 151 is moved downwardly to compress the elastic element 152, the corresponding upper contact 14212 is pushed by the elastic element 152. Consequently, the upper contact 14212 is penetrated through the corresponding perforation 1431 to be contacted with the corresponding lower contact 14112. Consequently, the corresponding membrane switch 144 is electrically conducted, and the luminous keyboard 1 generates the corresponding key signal. When the depressing force exerted on the key 15 is eliminated, an elastic force provided by the elastic element 152 is acted on the keycap 151. In response to the elastic force, the keycap 151 is moved upwardly relative to the supporting plate 13. Meanwhile, the first frame 1531 and the second frame 1532 of the scissors-type connecting element 153 are switched from the folded state to the open-scissors state, and the keycap 151 is returned to its original position.

Moreover, the lateral-emitting type illumination elements 16 are located at bilateral sides of the light guide plate 12 for emitting light beams. The light beams are incident into the light guide plate 12. The light guide plate 12 is disposed on the reflector 11. Moreover, plural light-guiding dots 121 are formed on a bottom surface of the light guide plate 12 for collecting and scattering the light beams. The light-guiding dots 121 are aligned with corresponding keys 15. After the light beams are incident into the light guide plate 12, the light beams are diffused into the whole light guide plate 12. Due to the ink properties of the light-guiding dots 121, the light beams will be scattered upwardly and downwardly. The portions of the light beams that are scattered upwardly will be sequentially transmitted through the openings 131 of the supporting plate 13 and the membrane wiring board 14 and then projected to the plural keys 15. The portions of the light beams that are scattered downwardly will be reflected by the reflector 11, and the reflected light beams are directed upwardly. Consequently, the light beams provided by the illumination elements 16 can be well utilized to illuminate the plural keys 15. However, the conventional luminous keyboard 1 still has the following drawbacks.

Firstly, although the reflector 11 can facilitate the light beams which are scattered downwardly from the light-guiding dots 121 to be reflected upwardly, a small amount of the light beams which are scattered downwardly from the light-guiding dots 121 may be transmitted through the reflector 11 because of the material of the reflector 11 of the conventional luminous keyboard 1. Under this circumstance, a portion of the light amount is lost.

Secondly, although the light beams can be diffused into the whole light guide plate 12 after the light beams are incident into the light guide plate 12, the light amount of the region farther from the lateral-emitting type illumination element 16 is less than the light amount of the region closer to the lateral-emitting type illumination element 16 because portions of the light beams have been reflected out of the light guide plate 12 by the light-guiding dot 121 closer to the lateral-emitting type illumination element 16.

Thirdly, since the travelling distance of the scissors-type connecting element 153 is long, the luminous keyboard 1 should have sufficient space to allow normal operations of the scissors-type connecting element 153. The necessary space is detrimental to the reduction of the thickness of the luminous keyboard 1. In other words, the conventional luminous keyboard 1 fails to meet the requirements of light weightiness, slimness and miniaturization.

In views of the first drawback and the second drawback, the uses of the lateral-emitting type illumination elements 16 and the light guide plate 12 of the conventional luminous keyboard 1 can illuminate the plural keys 15, but the light utilization efficiency is insufficient. For improving the light utilization efficiency, the lateral-emitting type illumination elements 16 may be replaced by bottom-emitting type illumination elements. The bottom-emitting type illumination elements are disposed under the keys 15 for providing light beams to the keys directly, so that the light utilization efficiency is enhanced. However, since the bottom-emitting type illumination element is located in the travelling path of the corresponding key 15, the action of depressing the keycap 151 fails to result in the electrical conduction of the corresponding membrane switch 144. In other words, the uses of the bottom-emitting type illumination elements to replace the lateral-emitting type illumination elements 16 and to provide the light beams to the keys 15 directly can not be effectively applied to the improvement of the conventional luminous keyboard 1.

Recently, a capacitive sensing keyboard is disclosed. The capacitive sensing keyboard can solve the third drawback of the conventional luminous keyboard 1. As the keycap is depressed, the electric field of a corresponding capacitive switch of a circuit board of the capacitive sensing keyboard is changed. In response to the change of the electric field, the circuit board generates a corresponding key signal. Since the scissors-type connecting element is not an essential component of the capacitive sensing keyboard, if the scissors-type connecting element is not used, the overall thickness of the capacitive sensing keyboard is effectively reduced. However, since the current capacitive sensing keyboard has no illuminating function, if the capacitive sensing keyboard is used in the dim environment, some problems may occur. For example, since the numbers and the characters marked on the keys of the capacitive sensing keyboard are not clearly visible, the dim environment becomes hindrance from operating the capacitive sensing keyboard or the user is readily suffered from vision impairment.

SUMMARY OF THE INVENTION

The present invention relates to a luminous keyboard, and more particularly to a luminous keyboard having enhanced light utilization efficiency and using a non-contact sensing technology.

In accordance with an aspect of the present invention, there is provided a luminous keyboard. The luminous keyboard includes a luminous keyboard. The luminous keyboard includes a sensing module, at least one key, at least one bottom-emitting type illumination element, and a light-transmissible supporting plate. The sensing module is used for generating at least one non-contact key signal. When the at least one key is depressed, the at least one non-contact key signal is correspondingly generated by the sensing module. The at least one bottom-emitting type illumination element is disposed under the at least one key for providing a light beam. The light-transmissible supporting plate arranged between the sensing module and the at least one key for supporting and connecting the at least one key. After the light beam from the at least one bottom-emitting type illumination element is transmitted through the light-transmissible supporting plate, the light beam is projected to the at least one key.

In an embodiment, the sensing module includes a sensing circuit pattern and a sensing circuit board, wherein the sensing circuit pattern is formed on the sensing circuit board.

In an embodiment, the sensing module further includes a driving circuit pattern. The driving circuit pattern is formed on the sensing circuit board for driving the at least one bottom-emitting type illumination element to provide the light beam.

In an embodiment, the luminous keyboard further includes a driving circuit board and a driving circuit pattern. The driving circuit pattern is formed on the driving circuit board for driving the at least one bottom-emitting type illumination element to provide the light beam. The sensing circuit board is arranged between the driving circuit board and the at least one key.

In an embodiment, the sensing module further includes at least one perforation corresponding to the at least one bottom-emitting type illumination element.

In an embodiment, the sensing circuit pattern includes at least one first electrode pattern and at least one second electrode pattern. When the sensing module is electrically conducted, an electric field between the at least one first electrode pattern and the at least one second electrode pattern is generated. As the at least one key is depressed and moved toward the sensing circuit pattern, the electric field is changed, so that the at least one non-contact key signal is correspondingly generated by the sensing module.

In an embodiment, the sensing module includes a sensing circuit pattern and a sensing membrane wiring board, wherein the sensing circuit pattern is formed on the sensing membrane wiring board.

In an embodiment, the sensing module further includes a driving circuit pattern. The driving circuit pattern is formed on the sensing membrane wiring board for driving the at least one bottom-emitting type illumination element to provide the light beam.

In an embodiment, the luminous keyboard further includes a driving circuit board and a driving circuit pattern. The driving circuit pattern is formed on the driving circuit board for driving the at least one bottom-emitting type illumination element to provide the light beam. The sensing membrane wiring board is arranged between the driving circuit board and the at least one key.

In an embodiment, the sensing module includes at least one perforation corresponding to the at least one bottom-emitting type illumination element.

In an embodiment, the sensing membrane wiring board is made of polyethylene terephthalate (PET), polycarbonate (PC), thermoplastic polyurethane (TPU) or polymethylmethacrylate (PMMA).

In an embodiment, the sensing circuit pattern includes at least one first electrode pattern and at least one second electrode pattern. When the sensing module is electrically conducted, an electric field between the at least one first electrode pattern and the at least one second electrode pattern is generated. As the at least one key is depressed and moved toward the sensing circuit pattern, the electric field is changed, so that the at least one non-contact key signal is correspondingly generated by the sensing module.

In an embodiment, the at least one key includes a keycap and a conductive element. The keycap is exposed outside the luminous keyboard. The conductive element is arranged between the keycap and the sensing module, and movable with the keycap. As the keycap is depressed, the conductive element is moved downwardly toward the sensing module, so that the at least one non-contact key signal is correspondingly generated by the sensing module.

In an embodiment, the conductive element is made of conductive foam, metallic material or metallic paint.

In an embodiment, the at least one key further includes a connecting element. The connecting element is connected between the light-transmissible supporting plate and the keycap, so that the keycap is movable upwardly or downwardly relative to the light-transmissible supporting plate.

In an embodiment, the connecting element is a scissors-type connecting element.

In an embodiment, the at least one key further includes plural elastic arms for allowing the keycap to be moved upwardly or downwardly relative to the sensing module. Each elastic arm includes a fixed end connected with the light-transmissible supporting plate and a free end connected with the keycap.

In an embodiment, the at least one key further includes a key frame and plural elastic arms. The key frame includes a hollow portion. The keycap is embedded into the hollow portion of the key frame. The plural elastic arms are used for allowing the keycap to be moved upwardly or downwardly relative to the sensing module. Each of the plural elastic arms includes a static inner arm part, a movable outer arm part and an angular transition part. The angular transition part is connected between the static inner arm part and the movable outer arm part.

In an embodiment, plural microstructures are formed on the light-transmissible supporting plate. After the light beam is transmitted through the plural microstructures, an optical path of the light beam is changed by the microstructures.

In an embodiment, each of the plural microstructures is a V-cut structure or a texturing structure.

In an embodiment, at least one lens is disposed on the light-transmissible supporting plate corresponding to the at least one bottom-emitting type illumination element. After the light beam is transmitted through the light-transmissible supporting plate, an optical path of the light beam is changed by the lens.

In an embodiment, the light-transmissible supporting plate includes at least one lens part corresponding to the at least one bottom-emitting type illumination element. After the light beam is transmitted through the light-transmissible supporting plate, an optical path of the light beam is changed by the at least one lens part. The at least one lens part is integrally formed with the light-transmissible supporting plate.

In an embodiment, the luminous keyboard further includes a metal base plate. The metal base plate is disposed under the sensing module.

In an embodiment, the at least one bottom-emitting type illumination element is a light emitting diode.

In an embodiment, the luminous keyboard is a capacitive sensing luminous keyboard.

In an embodiment, the luminous keyboard further includes a light-shading structure. The light-shading structure is formed on a part of a surface of the light-transmissible supporting plate.

In an embodiment, the light-shading structure is a light-shading layer.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
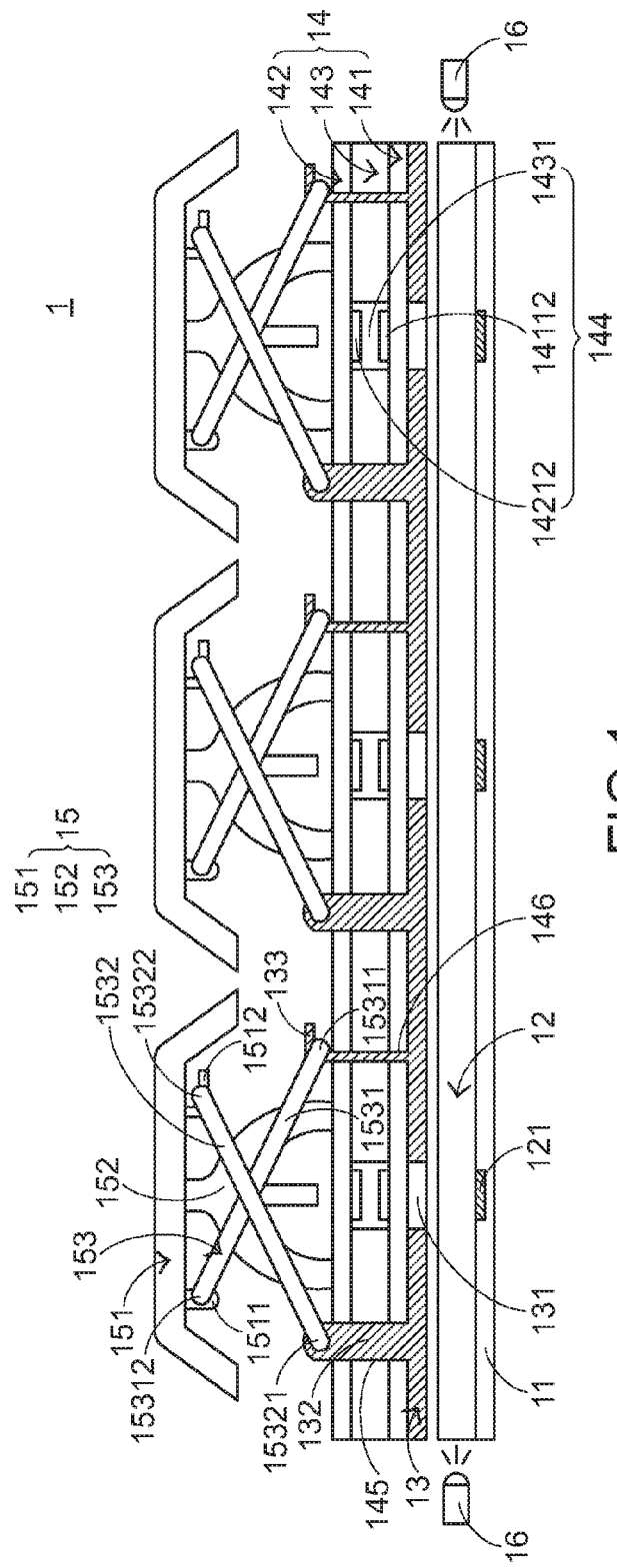
FIG. 1 is a schematic cross-sectional view illustrating a conventional luminous keyboard.
Figure 2:
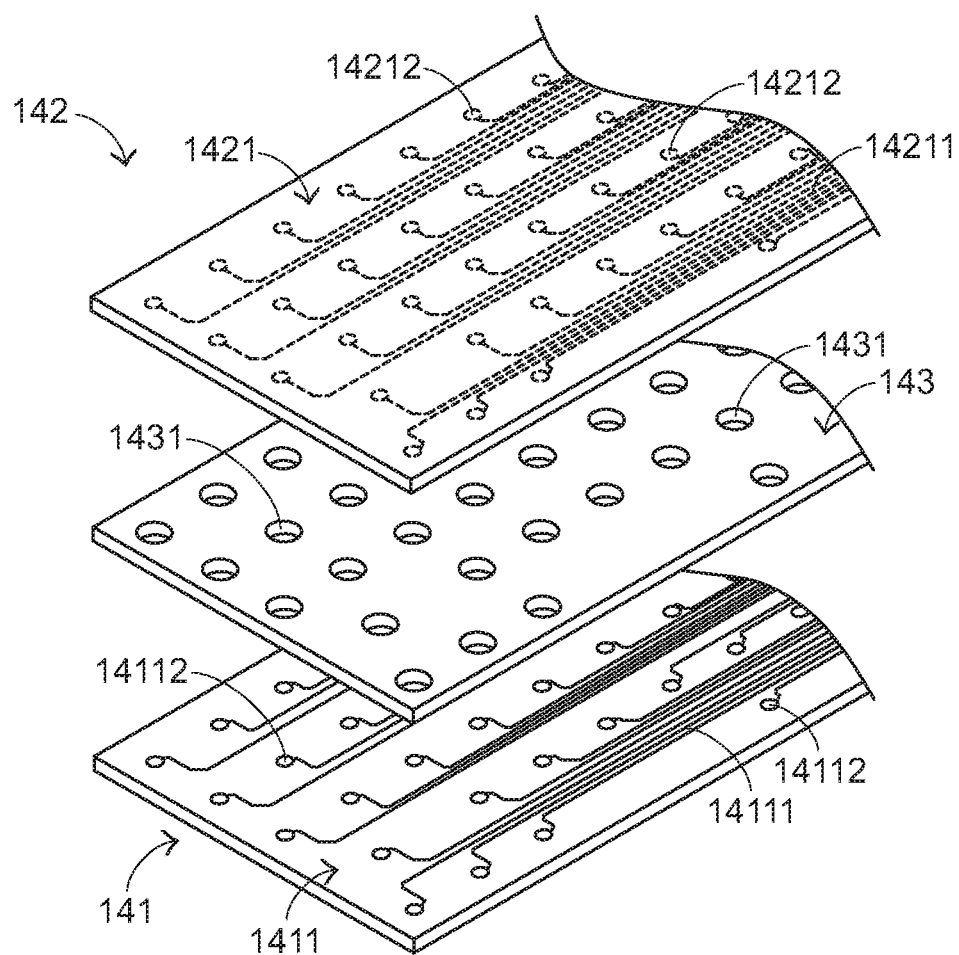
FIG. 2 is a schematic exploded view illustrating a membrane wiring board of the conventional luminous keyboard of FIG. 1.
Figure 3:
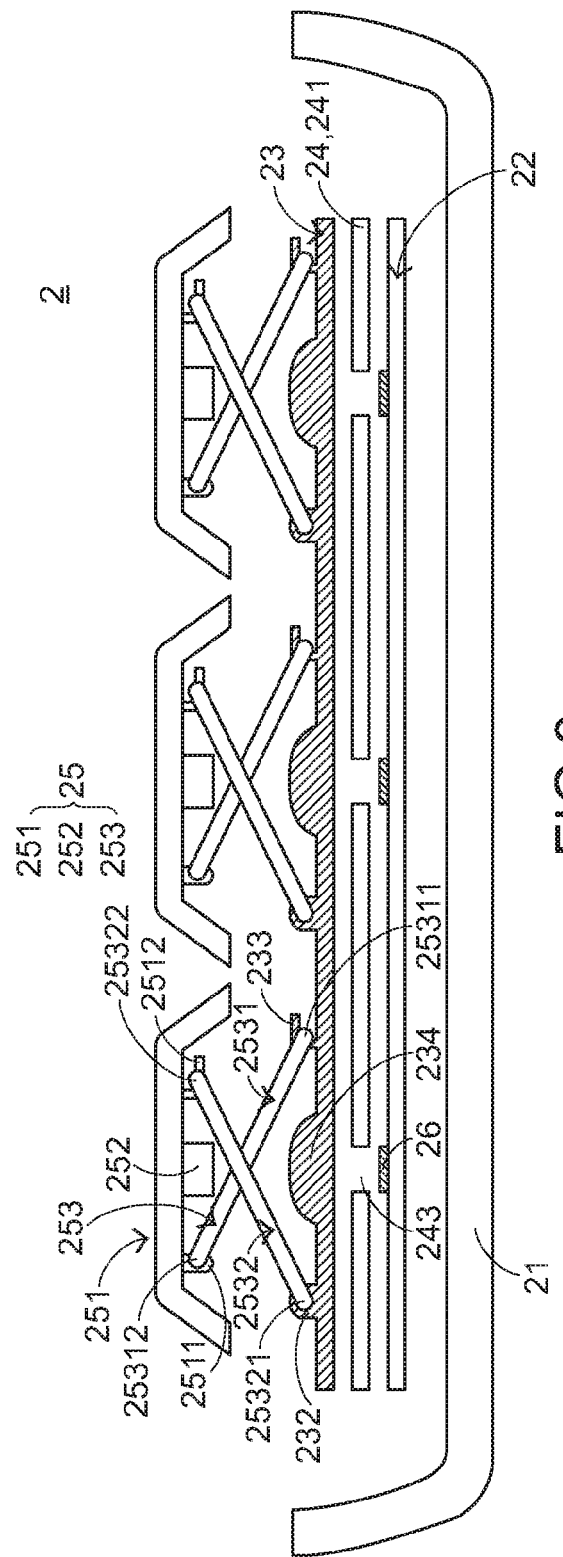
FIG. 3 is a schematic cross-sectional view illustrating a luminous keyboard according to a first embodiment of the present invention.
Figure 4:
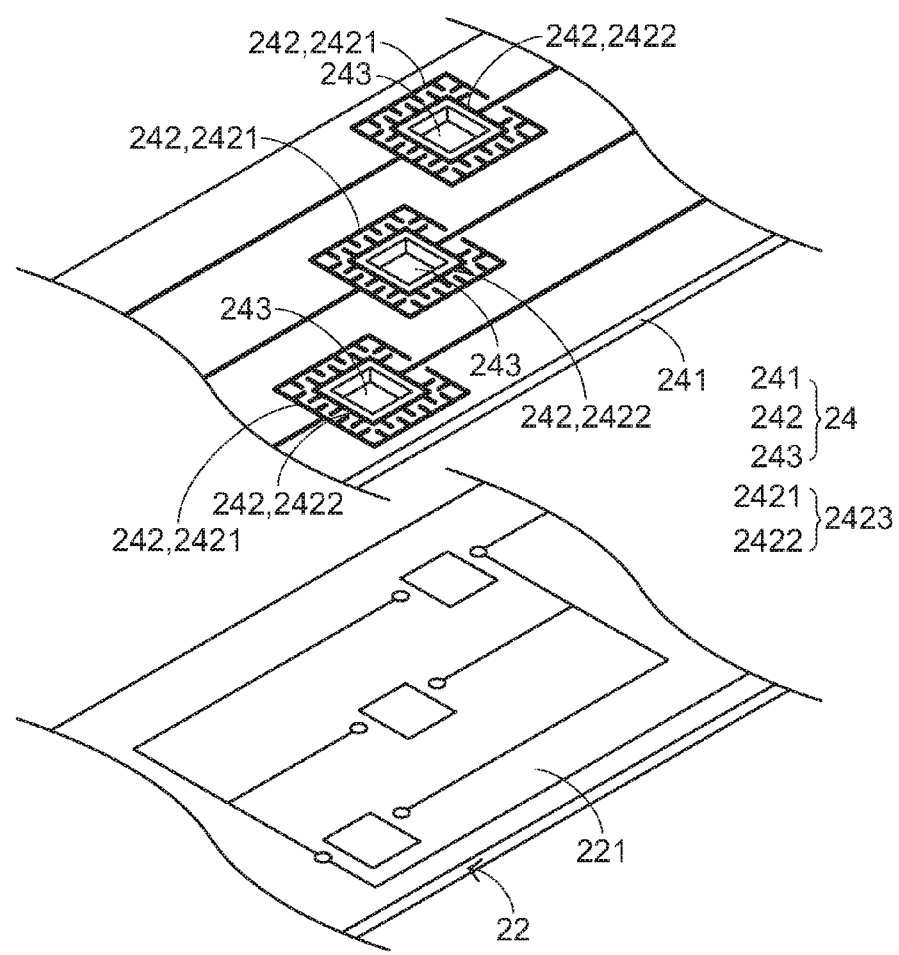
FIG. 4 is a schematic exploded view illustrating a sensing module and a driving circuit board of the luminous keyboard of FIG. 3.

FIG. 3 is a schematic cross-sectional view illustrating a luminous keyboard according to a first embodiment of the present invention. FIG. 4 is a schematic exploded view illustrating a sensing module and a driving circuit board of the luminous keyboard of FIG. 3. Please refer to FIGS. 3 and 4. From bottom to top, a base 21, a driving circuit board 22, a sensing module 24, a light-transmissible supporting plate 23, and plural keys 25 of the luminous keyboard 2 are sequentially shown. The luminous keyboard 2 further comprises plural bottom-emitting type illumination elements 26 corresponding to the plural keys 25. The base 21 is used for supporting the driving circuit board 22, the sensing module 24, the light-transmissible supporting plate 23, the plural keys 25 and the plural bottom-emitting type illumination elements 26. A driving circuit pattern 221 is formed on the driving circuit board 22. All of the bottom-emitting type illumination elements 26 are electrically connected with the driving circuit pattern 221. Consequently, each of the bottom-emitting type illumination elements 26 may be driven by the driving circuit board 22 to emit a light beam.

The light-transmissible supporting plate 23 is made of light-transmissible material, so that the light-transmissible supporting plate 23 is light-transmissible. Due to the light-transmissible property of the light-transmissible supporting plate 23, the light beam provided by each bottom-emitting type illumination element 26 can be transmitted through the light-transmissible supporting plate 23 and then projected to the corresponding key 25. In this embodiment, the bottom-emitting type illumination elements 26 are light emitting diodes, but are not limited thereto. However, those skilled in the art will readily observe that the numbers of the keys 25 and the bottom-emitting type illumination elements 26 may be varied according to the practical requirements.

In this embodiment, the luminous keyboard 2 is a capacitive luminous keyboard, and the sensing module 24 is a capacitive sensing module. The sensing module 24 comprises a sensing circuit board 241 and a sensing circuit pattern 242. The sensing circuit pattern 242 is formed on the sensing circuit board 241. For example, the sensing circuit board 241 is a printed circuit board with an insulated metal substrate (e.g. the conventional printed circuit board), but is not limited thereto. The sensing circuit pattern 242 comprises plural first electrode patterns 2421 and plural second electrode patterns 2422 corresponding to the plural first electrode patterns 2421, respectively. Each of the plural first electrode patterns 2421 and the corresponding second electrode patterns 2422 are separated from each other by a gap. Moreover, each of the plural first electrode patterns 2421 and the corresponding second electrode patterns 2422 are collaboratively defined as a capacitive key switch 2423. When the sensing module 24 is electrically conducted, plural electric fields are generated between the first electrode patterns 2421 and the corresponding second electrode patterns 2422. If one of the electric fields is changed, the corresponding capacitive key switch 2423 is triggered, so that the sensing module 24 generates a non-contact key signal. Moreover, the sensing module 24 further comprises plural perforations 243 corresponding to the plural bottom-emitting type illumination elements 26, respectively. The light beams provided by the bottom-emitting type illumination elements 26 can be transmitted through the perforations 243.

In this embodiment, each first electrode pattern 2421 and the corresponding second electrode pattern 2422 are discretely arranged on the same horizontal plane. It is noted that numerous modifications and alterations may be made while retaining the teachings of the invention. For example, in some other embodiments, each first electrode pattern 2421 and the corresponding second electrode pattern 2422 may be discretely arranged on different horizontal planes. That is, each first electrode pattern 2421 may be disposed over or under the corresponding second electrode pattern 2422. Moreover, a spacer layer (e.g. an UV adhesive layer) is coated or printed on the region between each first electrode pattern 2421 and the corresponding second electrode pattern 2422. Consequently, each first electrode pattern 2421 and the corresponding second electrode pattern 2422 are separated from each other vertically.

The way of generating the key signal in the capacitive sensing manner and the operating principle thereof are well known to those skilled in the art, and are not redundantly described herein. The configuration of the sensing circuit pattern 242 of FIG. 4 is presented herein for purpose of illustration and description only. It is noted that numerous modifications and alterations of the sensing circuit pattern 242 may be made while retaining the teachings of the invention. For example, in some other embodiments, the sensing module 24 is a magnetic sensing module or any other comparable non-contact sensing module.

Please refer to FIG. 3 again. The light-transmissible supporting plate 23 is used for supporting and connecting the plural keys 25. The plural keys 25 are aligned with the plural capacitive key switches 2423, respectively. Each key 25 comprises a keycap 251, a conductive element 252, and a connecting element 253. Each connecting element 253 is arranged between the light-transmissible supporting plate 23 and the corresponding keycap 251 for connecting the light-transmissible supporting plate 23 and the corresponding keycap 251. Moreover, due to the connecting element 253, the keycap 251 is movable upwardly or downwardly relative to the light-transmissible supporting plate 23. Each conductive element 252 is connected to a bottom surface of the corresponding keycap 251, and movable relative to the corresponding keycap 251. The conductive element 252 is made of conductive material. An example of the conductive material includes but is not limited to conductive foam, metallic material, graphite or metallic paint.

In this embodiment, the connecting element 253 is a scissors-type connecting element. Moreover, the scissors-type connecting element 253 comprises a first frame 2531 and a second frame 2532. The light-transmissible supporting plate 23 further comprises a first fixing structure 232 and a second fixing structure 233. The keycap 251 of each key 25 comprises a first keycap connecting structure 2511 and a second keycap connecting structure 2512. A first end 25311 of the first frame 2531 is connected to the second fixing structure 233, and a second end 25312 of the first frame 2531 is connected to the first keycap connecting structure 2511. In addition, a first end 25321 of the second frame 2532 is connected to the first fixing structure 232, and a second end 25322 of the second frame 2532 is connected to the second keycap connecting structure 2512. It is noted that the connection relationships between the connecting element 253, the light-transmissible supporting plate 23 and the keycap 251 are presented herein for purpose of illustration and description only.

As any keycap 251 is depressed and moved downwardly relative to the light-transmissible supporting plate 23, the first frame 2531 and the second frame 2532 of the corresponding connecting element 253 are switched from an open-scissors state to a folded state. Moreover, as the keycap 251 is moved downwardly, the corresponding conductive element 252 is moved toward the sensing circuit pattern 242. Under this circumstance, the electric field between the corresponding first electrode pattern 2421 and the corresponding second electrode pattern 2422 is changed. Due to the change of the electric field, the corresponding capacitive key switch 2423 is triggered. Consequently, the sensing module 24 generates the corresponding non-contact key signal.

In this embodiment, the luminous keyboard 2 further comprises a keycap-restoring means (not shown). When the depressing force exerted on the keycap 251 is eliminated, the keycap 251 is moved upwardly relative to the sensing module 24 in response to the keycap-restoring means. Under this circumstance, the first frame 2531 and the second frame 2532 are switched from the folded state to the open-scissors state, and the keycap 251 is returned to its original position. Moreover, the keycap-restoring means also provides a feedback tactile feel of depressing the keycap 251 to the user. In this embodiment, the keycap-restoring means is an elastic force or a magnetic force. That is, the keycap 251 is returned to its original position in response to the elastic force or the magnetic force. The way of generating the elastic force or the magnetic force is well known to those skilled in the art, and is not redundantly described herein.

Figure 5:
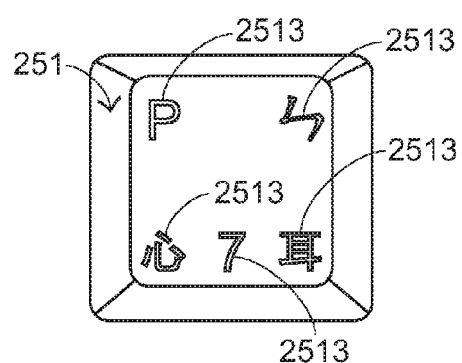
FIG. 5 is a schematic top view illustrating a keycap of the luminous keyboard of FIG. 3.

FIG. 5 is a schematic top view illustrating a keycap of the luminous keyboard of FIG. 3. As shown in FIG. 5, the keycap 251 comprises at least one light-outputting region 2513. For example, the light-outputting region 2513 is a light-outputting symbol region, a light-outputting number region or a light-outputting character region. After the light beams provided by any bottom-emitting type illumination element 26 is sequentially transmitted through the corresponding perforation 243 and the light-transmissible supporting plate 23 and projected to the corresponding keycap 251, the light beam is outputted from the light-outputting region 2513 of the keycap 251. Under this circumstance, the illuminated symbol, number or character of the key 25 is clearly visible to the user, and thus the operating difficulty in the dim environment can be overcome.

Generally, the light-outputting region 2513 is located at a corner of the keycap 251. However, since the distance between the light-transmissible supporting plate 23 and the keycap 251 is too short, the light beam passing through the light-transmissible supporting plate 23 fails to be effectively refracted to the light-outputting region 2513 at the corner of the keycap 251. In other words, a greater portion of the light beam is projected to the middle region of the keycap 251. Under this circumstance, the light utilization efficiency is still unsatisfied.

For increasing the light utilization efficiency, the light-transmissible supporting plate 23 further comprises plural lens parts 234 corresponding to the plural bottom-emitting type illumination elements 26, respectively. These lens parts 234 are integrally formed with the light-transmissible supporting plate 23. For example, each lens part 234 is a convex-concave lens, but is not limited thereto. That is, by specially designing the shape of the lens part 234, the lens part 234 has the lens function. Consequently, after the light beam is transmitted through the lens part 234, the optical path of the light beam is changed. That is, the light beam passing through the lens part 234 is propagated in the direction toward the light-outputting region 2513 of the keycap 251. The above way of diffusing the light beam from the light-transmissible supporting plate 23 to the light-outputting region 2513 of the keycap 251 is presented herein for purpose of illustration and description only. The scopes of the present invention are not restricted by the lens part 234. However, those skilled in the art will readily observe that numerous modifications and alterations may be made according to the practical requirements.

Figure 6:
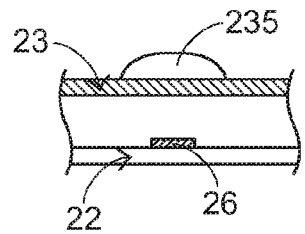
FIG. 6 is a schematic cross-sectional view illustrating a variant of the light-transmissible supporting plate of the luminous keyboard according to the present invention.

FIG. 6 is a schematic cross-sectional view illustrating a variant of the light-transmissible supporting plate of the luminous keyboard according to the present invention. For diffusing the light beam from the light-transmissible supporting plate 23 to the light-outputting region 2513 of the keycap 251, plural lenses 235 are disposed on the light-transmissible supporting plate 23. After the light beam is transmitted through the corresponding lens 235, the optical path of the light beam is changed by the lens 235. That is, the light beam passing through the lens 235 is propagated in the direction toward the light-outputting region 2513 of the keycap 251.

Figure 7:
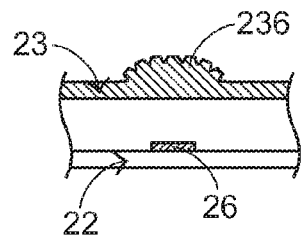
FIG. 7 is a schematic cross-sectional view illustrating another variant of the light-transmissible supporting plate of the luminous keyboard according to the present invention.
Figure 8:
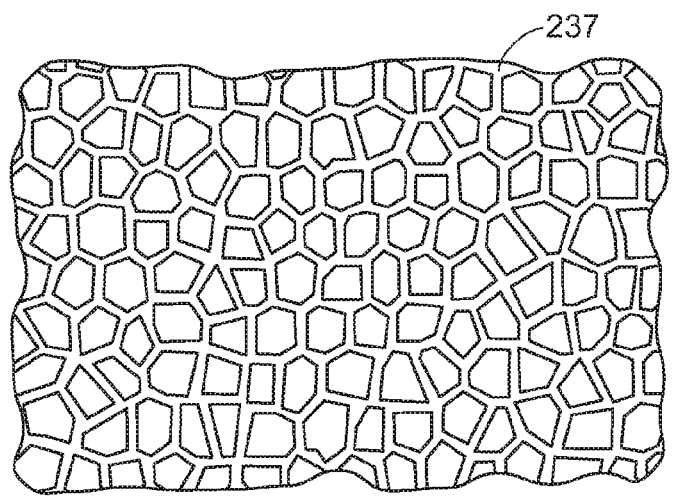
FIG. 8 is a schematic top view illustrating the microstructures formed on the surface of the light-transmissible supporting plate of the luminous keyboard according to the present invention.

FIG. 7 is a schematic cross-sectional view illustrating another variant of the light-transmissible supporting plate of the luminous keyboard according to the present invention. For diffusing the light beam from the light-transmissible supporting plate 23 to the light-outputting region 2513 of the keycap 251, plural microstructures 236 are formed on a surface of the light-transmissible supporting plate 236. After the light beam is transmitted through the microstructures 236, the optical path of the light beam is changed by the microstructures 236. That is, the light beam passing through the microstructures 236 is propagated in the direction toward the light-outputting region 2513 of the keycap 251. As shown in FIG. 7, the microstructures 236 are V-cut structures. However, the microstructures 236 are not restricted to the V-cut structures. For example, as shown in FIG. 8, the microstructures are texturing structures 237 formed on the surface of the light-transmissible supporting plate 23. The above variants of diffusing the light beam from the light-transmissible supporting plate 23 to the light-outputting region 2513 of the keycap 251 are presented herein for purpose of illustration and description only.

Figure 9:
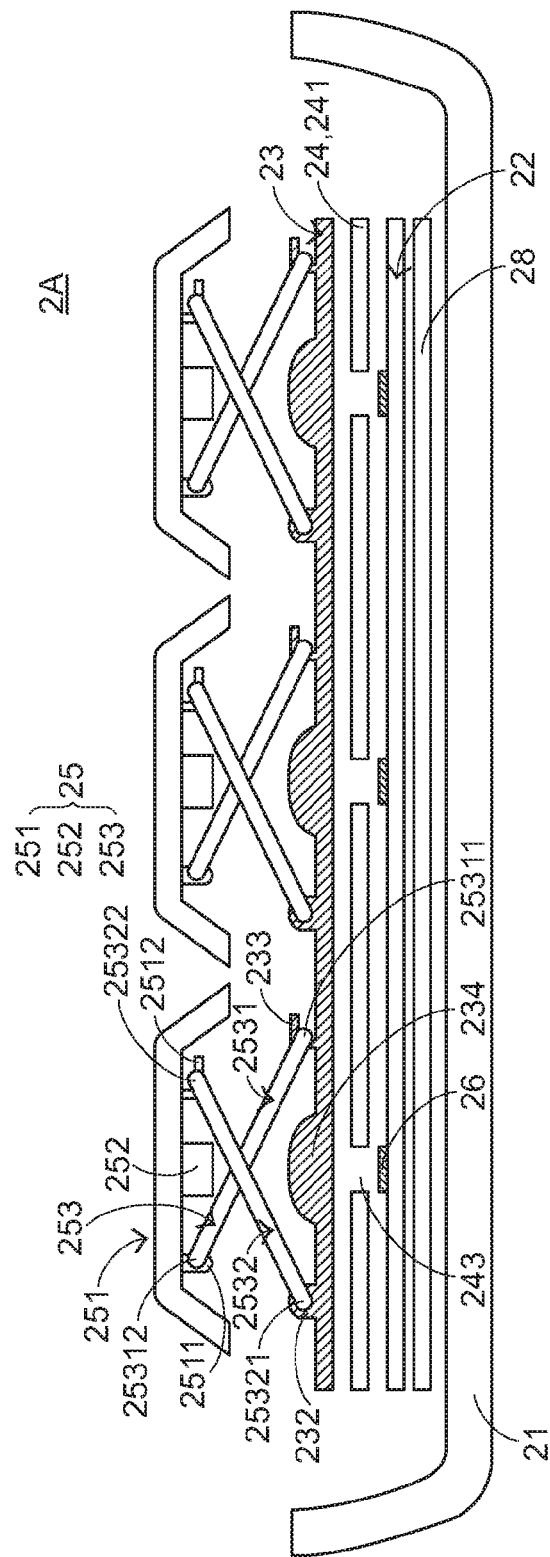
FIG. 9 is a schematic cross-sectional view illustrating a luminous keyboard according to a second embodiment of the present invention.

FIG. 9 is a schematic cross-sectional view illustrating a luminous keyboard according to a second embodiment of the present invention. Except that the luminous keyboard 2A of this embodiment further comprises a metal base plate 28, the other components of the luminous keyboard 2A are similar to those of the luminous keyboard of the first embodiment, and are not redundantly described herein. The metal base plate 28 is disposed under the sensing module 24 for providing a shielding effect. Due to the shielding effect, the interference between the electric fields of every two adjacent capacitive key switches 2423 can be inhibited.

Those skilled in the art will readily observe that the metal base plate 28 of the luminous keyboard of the second embodiment may be applied to the luminous keyboards of the following embodiments while retaining the teachings of the second embodiment of the present invention.

Figure 10:
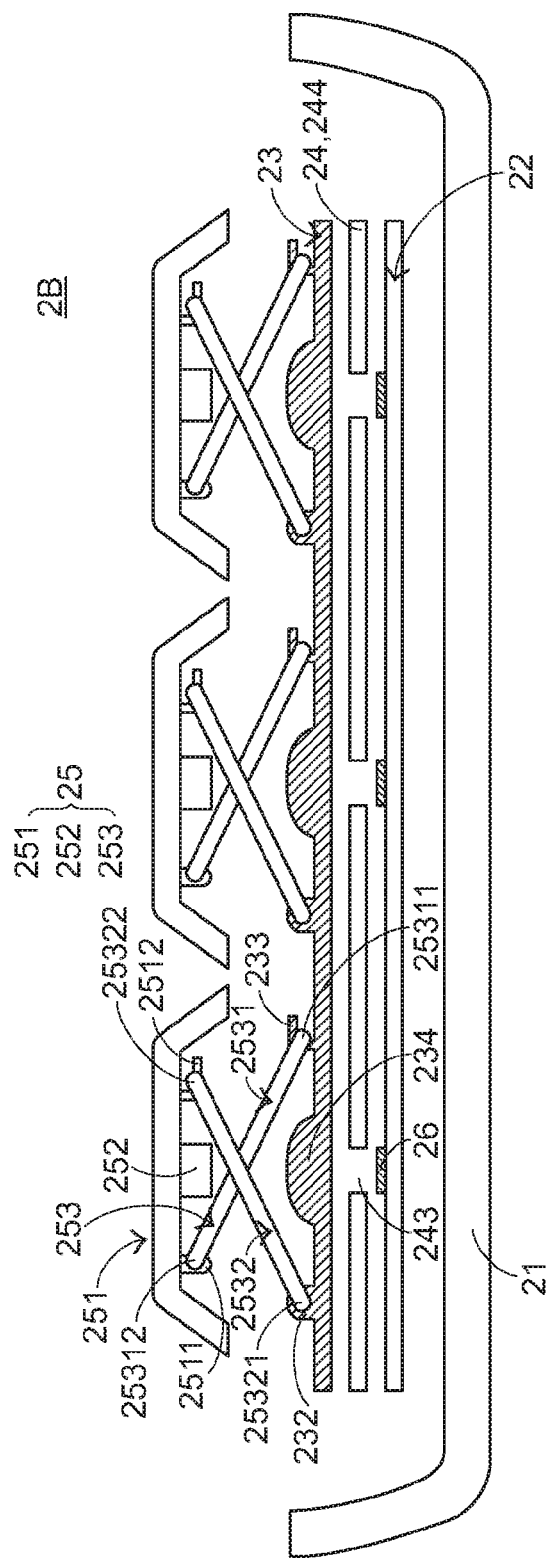
FIG. 10 is a schematic cross-sectional view illustrating a luminous keyboard according to a third embodiment of the present invention.

FIG. 10 is a schematic cross-sectional view illustrating a luminous keyboard according to a third embodiment of the present invention. Except that the luminous keyboard 2B of this embodiment comprises a sensing membrane wiring board 244 instead of the sensing circuit board 241, the other components of the luminous keyboard 2B are similar to those of the luminous keyboard of the first embodiment, and are not redundantly described herein. Preferably, the sensing membrane wiring board 244 is made of polyethylene terephthalate (PET), polycarbonate (PC), thermoplastic polyurethane (TPU) or polymethylmethacrylate (PMMA), but is not limited thereto.

Those skilled in the art will readily observe that the sensing membrane wiring board 244 of the luminous keyboard of the third embodiment may be applied to the luminous keyboards of the above embodiments and the following embodiments while retaining the teachings of the third embodiment of the present invention.

Figure 11:
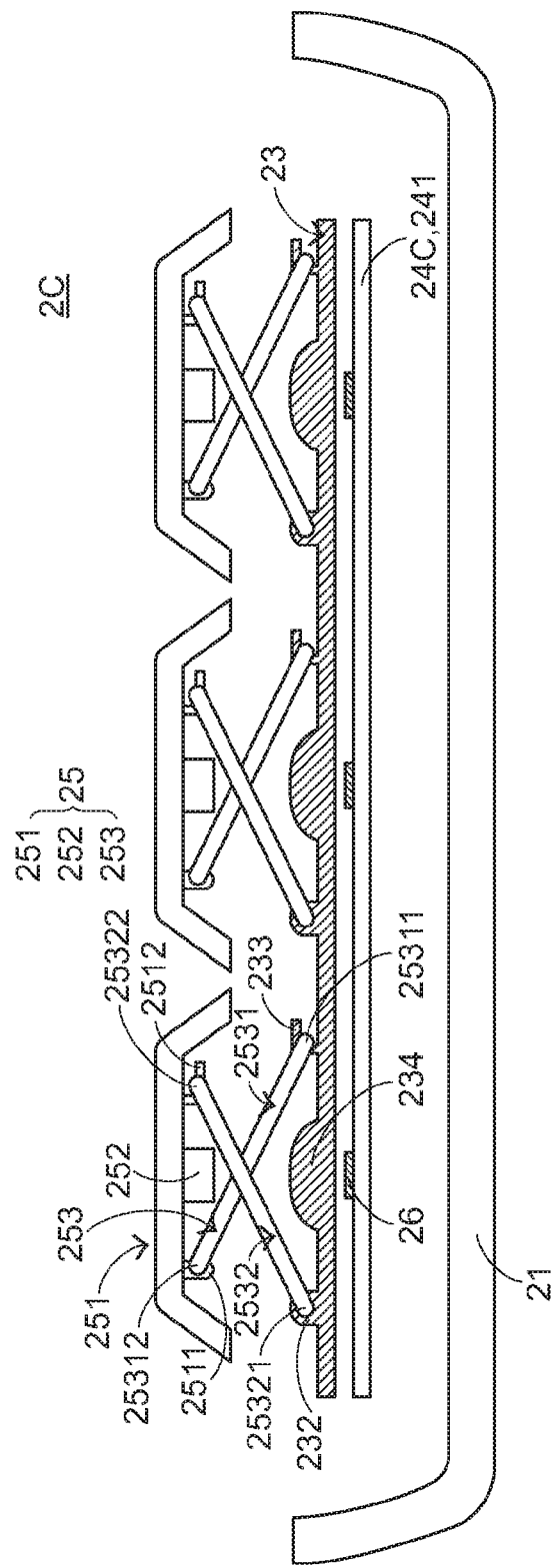
FIG. 11 is a schematic cross-sectional view illustrating a luminous keyboard according to a fourth embodiment of the present invention.
Figure 12:
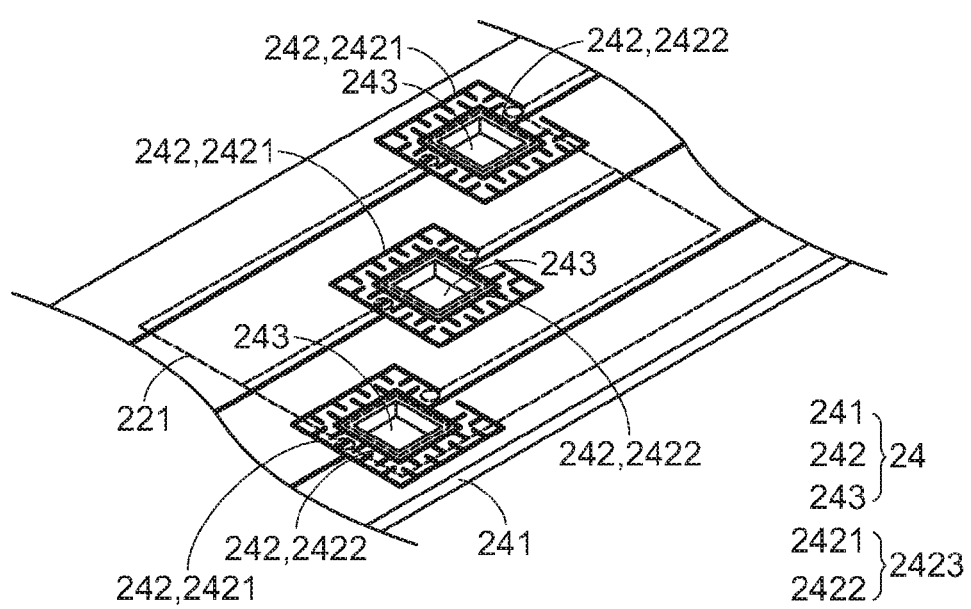
FIG. 12 is a schematic exploded view illustrating a sensing module of the luminous keyboard of FIG. 11.

FIG. 11 is a schematic cross-sectional view illustrating a luminous keyboard according to a fourth embodiment of the present invention. FIG. 12 is a schematic exploded view illustrating a sensing module of the luminous keyboard of FIG. 11. Please refer to FIGS. 11 and 12. Except that the driving circuit pattern 221 is formed on the sensing circuit board 241 of luminous keyboard 2C of this embodiment, the other components of the luminous keyboard 2C are similar to those of the luminous keyboard of the first embodiment, and are not redundantly described herein. In particular, the driving circuit pattern 221 is disposed over or under the sensing circuit pattern 242. Moreover, a spacer layer (e.g. an UV adhesive layer) is coated or printed on the region between the driving circuit pattern 221 and the sensing circuit pattern 242. Consequently, the driving circuit pattern 221 and the sensing circuit pattern 242 are separated from each other vertically. Consequently, in this embodiment, the bottom-emitting type illumination element 26 may be directly disposed on the sensing module 24C. That is, the driving circuit board 22 used in the first embodiment is not included in the luminous keyboard 2C of the present invention, and the sensing module 24C has no perforations.

Those skilled in the art will readily observe that the relationships between the components of the luminous keyboard of the fourth embodiment may be applied to the luminous keyboards of the above embodiments and the following embodiments while retaining the teachings of the fourth embodiment of the present invention.

Figure 13:
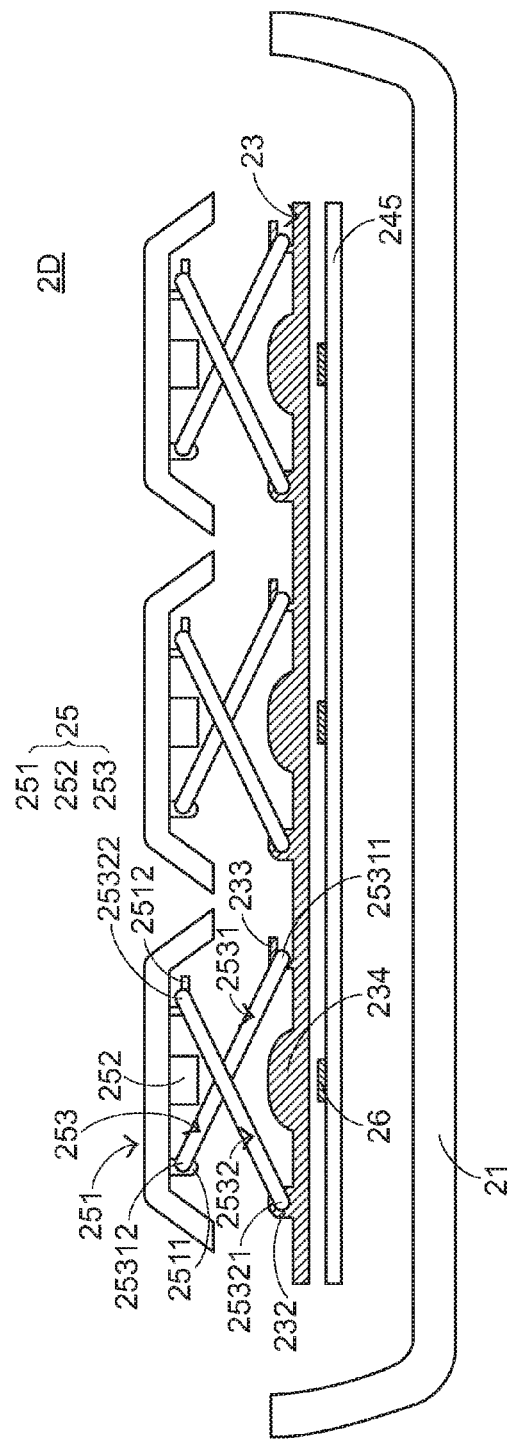
FIG. 13 is a schematic cross-sectional view illustrating a luminous keyboard according to a fifth embodiment of the present invention.

FIG. 13 is a schematic cross-sectional view illustrating a luminous keyboard according to a fifth embodiment of the present invention. Except that the luminous keyboard 2D of this embodiment comprises a sensing membrane wiring board 245 instead of the sensing circuit board 241, the other components of the luminous keyboard 2D are similar to those of the luminous keyboard of the fourth embodiment, and are not redundantly described herein. Preferably, the sensing membrane wiring board 245 is made of polyethylene terephthalate (PET), polycarbonate (PC), thermoplastic polyurethane (TPU) or polymethylmethacrylate (PMMA), but is not limited thereto.

In the above embodiments, the cooperation of the light-transmissible supporting plate 23 and the scissors-type connecting element 253 allows the keycap 251 and the conductive element 252 to be moved upwardly or downwardly relative to the sensing module 24 or 24C. The way of allowing the keycap 251 and the conductive element 252 to be moved upwardly or downwardly relative to the sensing module 24 or 24C is presented herein for purpose of illustration and description only. However, those skilled in the art will readily observe that numerous modifications and alterations may be made according to the practical requirements. It is noted that the scissors-type connecting element 253 is not an essential component for limiting the scopes of the present invention.

Figure 14:
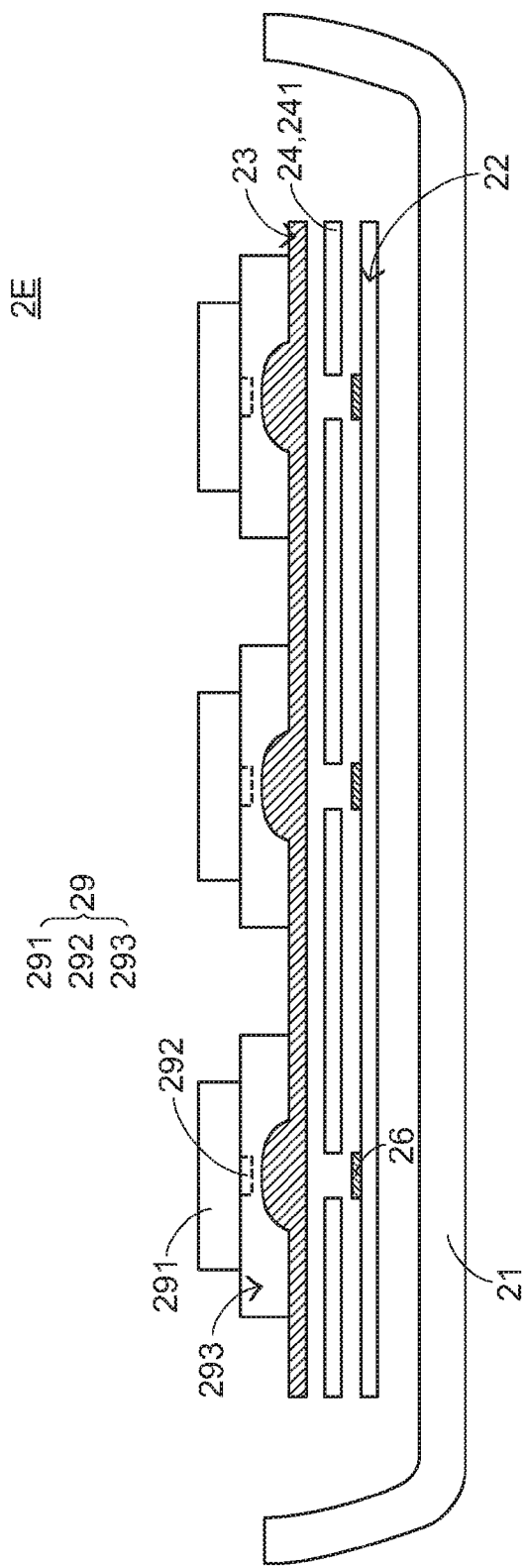
FIG. 14 is a schematic cross-sectional view illustrating a luminous keyboard according to a sixth embodiment of the present invention.
Figure 15:
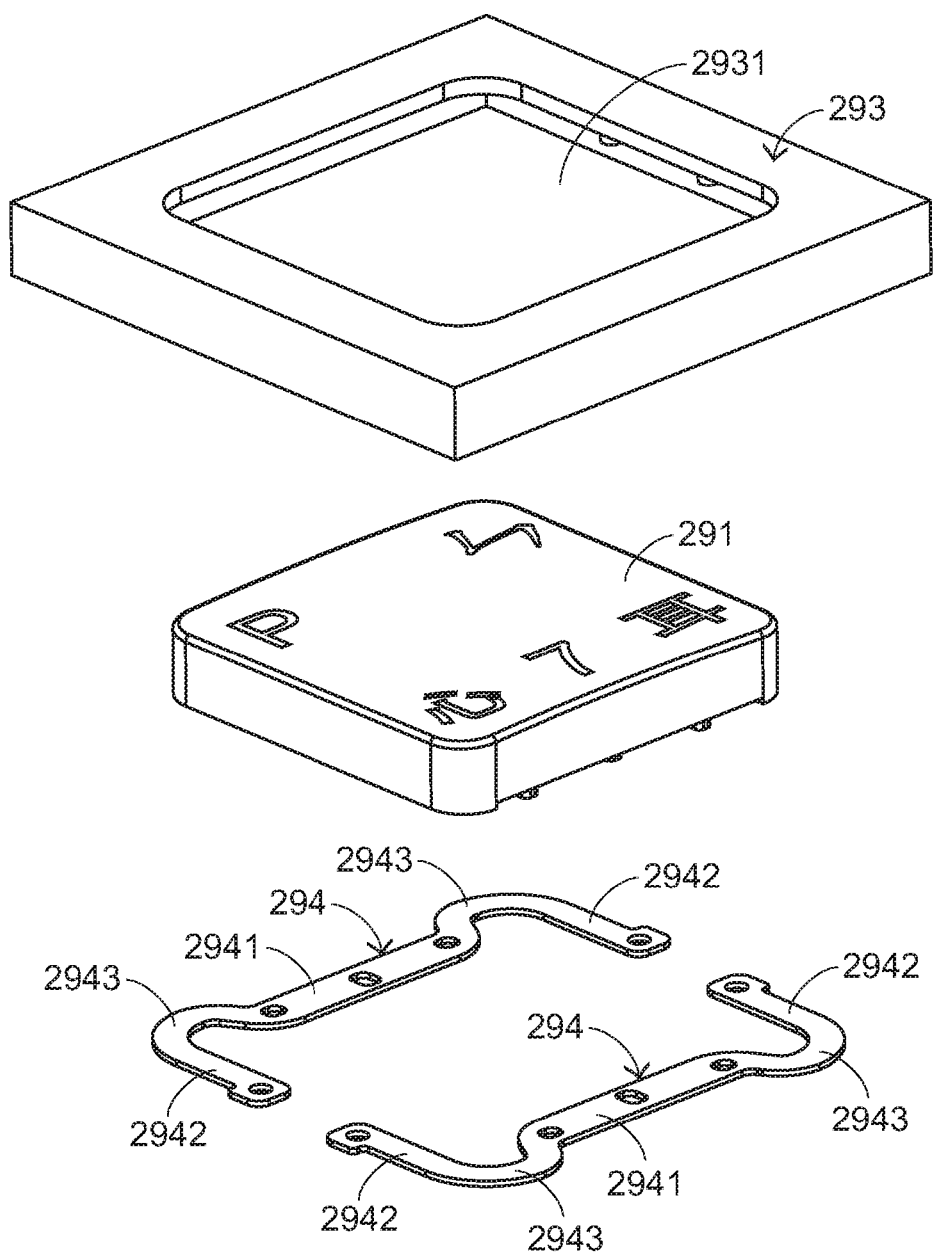
FIG. 15 is a schematic exploded view illustrating a key of the luminous keyboard of FIG. 14.
Figure 16:
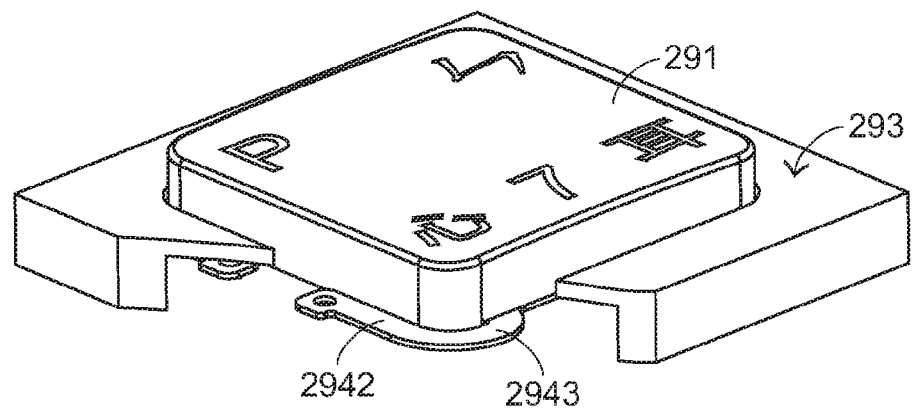
FIG. 16 is a schematic cutaway view illustrating the key of the luminous keyboard of FIG. 14, in which the key is not depressed.
Figure 17:
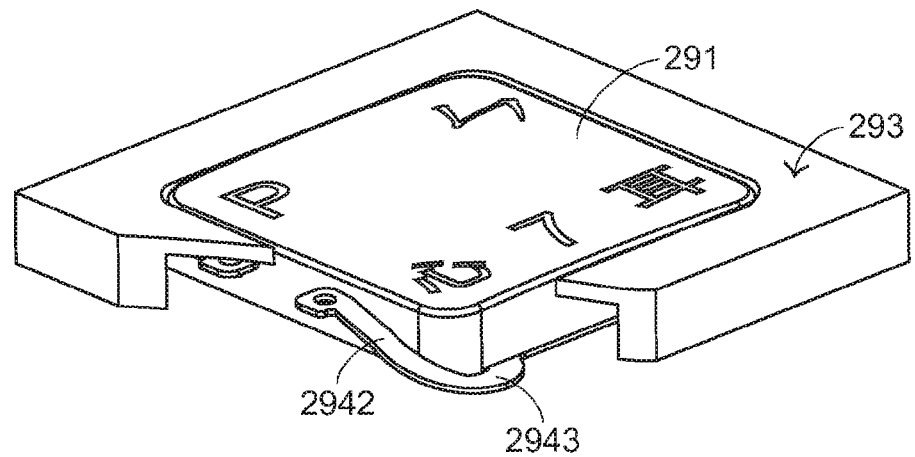
FIG. 17 is a schematic cutaway view illustrating the key of the luminous keyboard of FIG. 14, in which the key is depressed.

Hereinafter, another embodiment of a luminous keyboard will be illustrated with reference to FIGS. 14~47. FIG. 14 is a schematic cross-sectional view illustrating a luminous keyboard according to a sixth embodiment of the present invention. FIG. 15 is a schematic exploded view illustrating a key of the luminous keyboard of FIG. 14. FIG. 16 is a schematic cutaway view illustrating the key of the luminous keyboard of FIG. 14, in which the key is not depressed. FIG. 17 is a schematic cutaway view illustrating the key of the luminous keyboard of FIG. 14, in which the key is depressed. Except for the following items, the other components of the luminous keyboard 2E of this embodiment are similar to those of the luminous keyboard of the first embodiment, and are not redundantly described herein.

In comparison with the first embodiment, the scissors-type connecting element 253 is not included in the luminous keyboard 2E of this embodiment. Especially, each key 29 comprises a keycap 291, a conductive element 292, a key frame 293, and plural elastic arms 294. Each of the elastic arms 294 is a flat strip comprising a static inner arm part 2941, a movable outer arm part 2942, and an angular transition part 2943. The movable outer arm part 2942 is perpendicular to the static inner arm part 2941. The angular transition part 2943 is connected between the static inner arm part 2941 and the movable outer arm part 2942. The key frame 293 has a hollow portion 2931. The keycap 291 is embedded into the hollow portion 2931 of the key frame 293. The static inner arm part 2941 of each elastic arm 294 is fixed on the bottom of the keycap 291. The movable outer arm part 2942 of each elastic arm 294 is exposed externally from the bottom of the keycap 291 and fixed on the key frame 293. The angular transition part 2943 of each elastic arm 294 is exposed externally from a corner of the bottom of the keycap 291.

In a case that any keycap 291 is not depressed, the movable outer arm part 2942 and the angular transition part 2943 of each elastic arm 294 are not subjected to deformation (see FIG. 16). As any keycap 291 is depressed, the angular transition part 2943 of the elastic arm 294 is pressed by the corner of the bottom of the keycap 291. Under this circumstance, both of the movable outer arm part 2942 and the angular transition part 2943 of the elastic arm 294 are subjected to deformation (see FIG. 17). Moreover, as the keycap 291 is moved downwardly, the conductive element 292 is correspondingly moved toward the sensing module 24. Meanwhile, the corresponding capacitive key switch is triggered, and thus the sensing module 24 generates the corresponding non-contact key signal. For clarification and brevity, the capacitive key switch is not shown. The operations of the capacitive key switch are similar to those of the first embodiment, and are not redundantly described herein. When the depressing force exerted on the keycap 291 is eliminated, an elastic force provided by the corresponding elastic arm 294 is acted on the keycap 291. In response to the elastic force, the keycap 291 is returned to its original position.

In the luminous keyboard 2E of this embodiment, the scissors-type connecting element is not included, but the keycap and the conductive element are movable upwardly or downwardly relative to the sensing module. Under this circumstance, the overall thickness of the luminous keyboard can be further reduced. The luminous keyboard is presented herein for purpose of illustration and description only. However, those skilled in the art will readily observe that the key structure of the sixth embodiment may be applied to the above embodiments from the first embodiment to the fifth embodiment while retaining the teachings of the sixth embodiment of the present invention.

Figure 18:
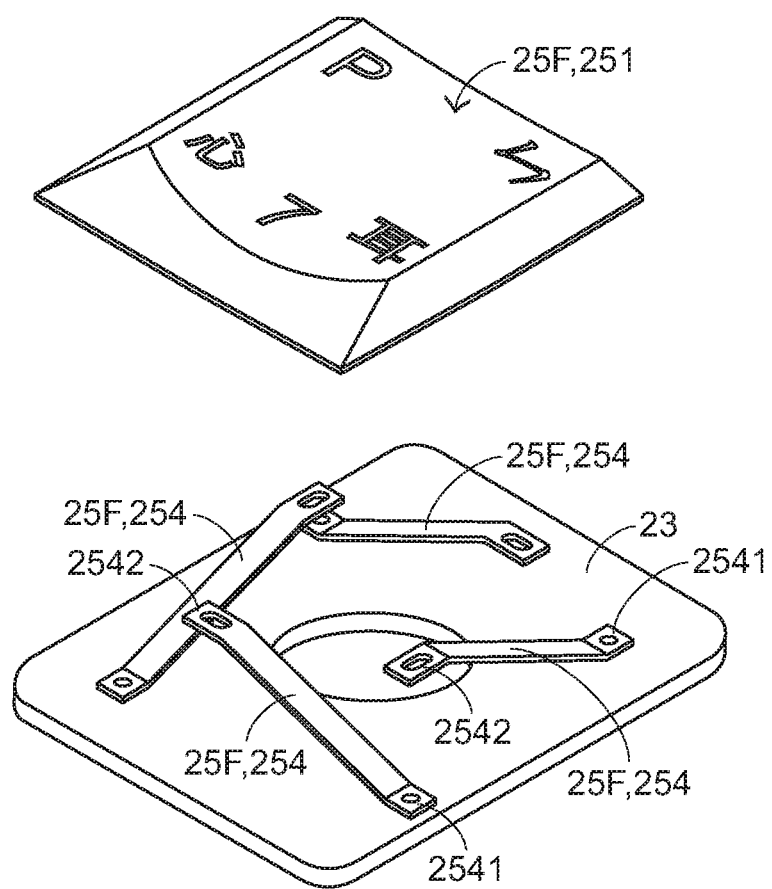
FIG. 18 is a schematic exploded view illustrating a key and a light-transmissible supporting plate of a luminous keyboard according to a seventh embodiment of the present invention.

FIG. 18 is a schematic exploded view illustrating a key and a light-transmissible supporting plate of a luminous keyboard according to a seventh embodiment of the present invention. Except for the following items, the other components of the luminous keyboard of this embodiment are similar to those of the luminous keyboard of the first embodiment, and are not redundantly described herein.

In comparison with the first embodiment, the scissors-type connecting element 253 is not included in the luminous keyboard of the seventh embodiment. Moreover, each key 25F further comprises plural elastic arms 254. The plural elastic arms 254 are arranged between the keycap 251 and the light-transmissible supporting plate 23. Each elastic arm 254 comprises a fixed end 2541 and a free end 2542. The fixed end 2541 of each elastic arm 254 is connected with the light-transmissible supporting plate 23. The free end 2542 of each elastic arm 254 is connected with the bottom of the keycap 251. As any keycap 251 is depressed, the free end 2542 of each elastic arm 254 is pressed by the keycap 251. Under this circumstance, the free end 2542 of each elastic arm 254 is moved downwardly with the keycap 251, and the free end 2542 of each elastic arm 254 provides an elastic force to the keycap 251. When the depressing force exerted on the keycap 251 is eliminated, the keycap 251 is returned to its original position in response to the elastic force provided by each elastic arm 254.

However, those skilled in the art will readily observe that the key structure of the seventh embodiment may be applied to the above embodiments from the first embodiment to the fifth embodiment while retaining the teachings of the seventh embodiment of the present invention.

Figure 19:
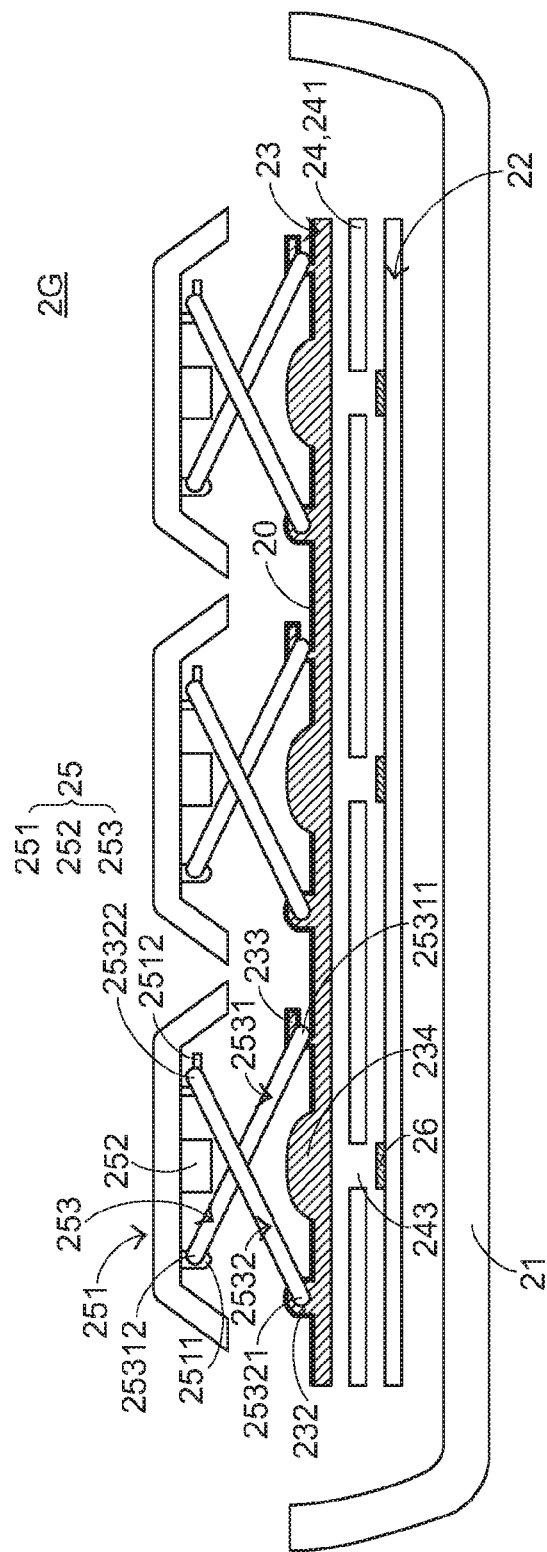
FIG. 19 is a schematic cross-sectional view illustrating a luminous keyboard according to an eighth embodiment of the present invention.

FIG. 19 is a schematic cross-sectional view illustrating a luminous keyboard according to an eighth embodiment of the present invention. Except for the following items, the other components of the luminous keyboard 2G of this embodiment are similar to those of the luminous keyboard of the first embodiment, and are not redundantly described herein. In comparison with the first embodiment, a light-shading structure 20 (e.g. a light-shading layer) is formed on an outer surface of the light-transmissible supporting plate 23. The light beam from the bottom-emitting type illumination element 26 fails to be transmitted through the light-shading structure 20, but the light beam is only transmissible through the portion of the light-transmissible supporting plate 23 which is not shaded by the light-shading structure 20. Due to the light-shading structure 20, the light beam provided by the bottom-emitting type illumination element 26 fails to be leaked to any place where the light beam is not needed. In this embodiment, the light-shading structure 20 is formed on the outer surface of the light-transmissible supporting plate 23. The luminous keyboard is presented herein for purpose of illustration and description only. It is noted that numerous modifications and alterations may be made while retaining the teachings of the invention. For example, in some other embodiments, the light-shading structure may be formed on an inner surface of the light-transmissible supporting plate 23.

However, those skilled in the art will readily observe that the light-shading structure 20 of the eighth embodiment may be applied to all of the above embodiments while retaining the teachings of the eighth embodiment of the present invention. That is, in all of the above embodiments, the light-shading structure 20 may be formed on the surface of the light-transmissible supporting plate in order to prevent the light beam provided by the bottom-emitting type illumination element 26 from being leaked to any place where the light beam is not needed From the above descriptions, the present invention provides a luminous keyboard. In the luminous keyboard of the present invention, a bottom-emitting type illumination element is directly disposed under a corresponding key. Moreover, a supporting plate for connecting the key is light-transmissible. Consequently, the light beam provided by the bottom-emitting type illumination element is directly transmitted through the light-transmissible supporting plate and then projected to the key. Under this circumstance, the light utilization efficiency is enhanced. Moreover, since the luminous keyboard of the present invention comprises a non-contact sensing module, even if the bottom-emitting type illumination elements are directly disposed under the keys, the operations of the sensing module are not hindered. In comparison with the conventional non-sensing keyboard without the illuminating function, the luminous keyboard of the present invention has industrial applicability.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A luminous keyboard, comprising:
    a sensing module for generating at least one non-contact key signal;
    at least one key, comprising:
        a keycap comprising at least one light-outputting region located at a corner or edge of said keycap; and
        a conductive element arranged between said keycap and said sensing module, and movable with said keycap, wherein as said keycap is depressed, said conductive element is moved downwardly toward said sensing module, so that said at least one non-contact key signal is correspondingly generated by said sensing module;
    at least one bottom-emitting type illumination element being an active light source and being vertically aligned and disposed under said at least one conductive element and at least one key for emitting an upward light beam toward said at least one key; and
    a light-transmissible supporting plate arranged between said sensing module and said at least one key for supporting and connecting said at least one key, and covering said at least one bottom-emitting type illumination element while allowing said upward light beam to transmit therethrough, wherein at least one lens is disposed on said light-transmissible supporting plate corresponding to said at least one bottom-emitting type illumination element and the at least one conductive element, wherein after said upward light beam is transmitted through said light-transmissible supporting plate, an optical path of said upward light beam is changed by said lens and directed toward said light-outputting region of said keycap.

2. The luminous keyboard according to claim 1, wherein said sensing module comprises a sensing circuit pattern and a sensing circuit board, wherein said sensing circuit pattern is formed on said sensing circuit board.

3. The luminous keyboard according to claim 2, wherein said sensing module further comprises a driving circuit pattern, wherein said driving circuit pattern is formed on said sensing circuit board for driving said at least one bottom-emitting type illumination element to provide said light beam.

4. The luminous keyboard according to claim 2, wherein said luminous keyboard further comprises a driving circuit board and a driving circuit pattern, wherein said driving circuit pattern is formed on said driving circuit board for driving said at least one bottom-emitting type illumination element to provide said light beam, wherein said sensing circuit board is arranged between said driving circuit board and said at least one key.

5. The luminous keyboard according to claim 4, wherein said sensing module further comprises at least one perforation corresponding to said at least one bottom-emitting type illumination element.

6. The luminous keyboard according to claim 2, wherein said sensing circuit pattern comprises at least one first electrode pattern and at least one second electrode pattern, wherein when said sensing module is electrically conducted, an electric field between said at least one first electrode pattern and said at least one second electrode pattern is generated, wherein as said at least one key is depressed and moved toward said sensing circuit pattern, said electric field is changed, so that said at least one non-contact key signal is correspondingly generated by said sensing module.

7. The luminous keyboard according to claim 1, wherein said sensing module comprises a sensing circuit pattern and a sensing membrane wiring board, wherein said sensing circuit pattern is formed on said sensing membrane wiring board.

8. The luminous keyboard according to claim 7, wherein said sensing module further comprises a driving circuit pattern, wherein said driving circuit pattern is formed on said sensing membrane wiring board for driving said at least one bottom-emitting type illumination element to provide said light beam.

9. The luminous keyboard according to claim 7, wherein said luminous keyboard further comprises a driving circuit board and a driving circuit pattern, wherein said driving circuit pattern is formed on said driving circuit board for driving said at least one bottom-emitting type illumination element to provide said light beam, wherein said sensing membrane wiring board is arranged between said driving circuit board and said at least one key.

10. The luminous keyboard according to claim 9, wherein said sensing module comprises at least one perforation corresponding to said at least one bottom-emitting type illumination element.

11. The luminous keyboard according to claim 7, wherein said sensing membrane wiring board is made of polyethylene terephthalate (PET), polycarbonate (PC), thermoplastic polyurethane (TPU) or polymethylmethacrylate (PMMA).

12. The luminous keyboard according to claim 7, wherein said sensing circuit pattern comprises at least one first electrode pattern and at least one second electrode pattern, wherein when said sensing module is electrically conducted, an electric field between said at least one first electrode pattern and said at least one second electrode pattern is generated, wherein as said at least one key is depressed and moved toward said sensing circuit pattern, said electric field is changed, so that said at least one non-contact key signal is correspondingly generated by said sensing module.

13. The luminous keyboard according to claim 1, wherein said conductive element is made of conductive foam, metallic material or metallic paint.

14. The luminous keyboard according to claim 1, wherein said at least one key further comprises a connecting element, wherein said connecting element is connected between said light-transmissible supporting plate and said keycap, so that said keycap is movable upwardly or downwardly relative to said light-transmissible supporting plate.

15. The luminous keyboard according to claim 14, wherein said connecting element is a scissors-type connecting element.

16. The luminous keyboard according to claim 1, wherein said at least one key further comprises plural elastic arms for allowing said keycap to be moved upwardly or downwardly relative to said sensing module, wherein each elastic arm comprises a fixed end connected with said light-transmissible supporting plate and a free end connected with said keycap.

17. The luminous keyboard according to claim 1, wherein said at least one key further comprises:
a key frame comprising a hollow portion, wherein said keycap is embedded into said hollow portion of said key frame; and
plural elastic arms for allowing said keycap to be moved upwardly or downwardly relative to said sensing module, wherein each of said elastic arms comprises a static inner arm part, a movable outer arm part and an angular transition part, wherein said angular transition part is connected between said static inner arm part and said movable outer arm part.

18. The luminous keyboard according to claim 1, wherein said at least one lens part is integrally formed with said light-transmissible supporting plate.

19. The luminous keyboard according to claim 1, wherein said luminous keyboard further comprises a metal base plate, wherein said metal base plate is disposed under said sensing module.

20. The luminous keyboard according to claim 1, wherein said at least one bottom-emitting type illumination element is a light emitting diode.

21. The luminous keyboard according to claim 1, wherein said luminous keyboard is a capacitive sensing luminous keyboard.

22. The luminous keyboard according to claim 1, wherein said luminous keyboard further comprises a light-shading structure, wherein said light-shading structure is formed on a part of a surface of said light-transmissible supporting plate.

23. The luminous keyboard according to claim 22, wherein said light-shading structure is a light-shading layer.

* * * * *